(12) United States Patent
Lee et al.

(10) Patent No.: US 10,243,076 B2
(45) Date of Patent: Mar. 26, 2019

(54) TERNARY BARRISTOR WITH SCHOTTKY JUNCTION GRAPHENE SEMICONDUCTOR

(71) Applicant: GWANGJU INSTITUTE OF SCIENCE AND TECHNOLOGY, Gwangju (KR)

(72) Inventors: Byoung Hun Lee, Gwangju (KR); Chang Hoo Shim, Gwangju (KR); Yun Ji Kim, Gwangju (KR); So Young Kim, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 15/809,024

(22) Filed: Nov. 10, 2017

(65) Prior Publication Data

US 2018/0138315 A1 May 17, 2018

(30) Foreign Application Priority Data

Nov. 11, 2016 (KR) .......................... 10-2016-0150019

(51) Int. Cl.

| H01L 29/78 | (2006.01) |
|---|---|
| H01L 29/16 | (2006.01) |
| H01L 29/66 | (2006.01) |
| H01L 29/10 | (2006.01) |
| H01L 29/167 | (2006.01) |
| H01L 29/72 | (2006.01) |

(52) U.S. Cl.
CPC .......... *H01L 29/7839* (2013.01); *H01L 29/10* (2013.01); *H01L 29/1041* (2013.01); *H01L 29/1606* (2013.01); *H01L 29/167* (2013.01); *H01L 29/66037* (2013.01); *H01L 29/72* (2013.01)

(58) Field of Classification Search
CPC ............. H01L 29/7839; H01L 29/1606; H01L 29/66015; H01L 29/13088; H01L 29/167; H01L 29/1041; H01L 29/1045; H01L 29/786; H01L 51/0562; H01L 51/0566
See application file for complete search history.

(56) References Cited

U.S. PATENT DOCUMENTS

2016/0126317 A1* 5/2016 Kim .................... H01L 29/1606
257/29

* cited by examiner

*Primary Examiner* — Thanhha S Pham
(74) *Attorney, Agent, or Firm* — Hauptman Ham, LLP

(57) ABSTRACT

Disclosed is a graphene-based ternary barristor using a Schottky junction graphene semiconductor. A graphene channel layer is doped with N-type and N-type dopants to have two different Fermi levels and form a PN junction. Accordingly, a voltage is applied to a gate electrode layer to move the Fermi levels of the graphene channel layer and adjust the height of the Schottky barrier, thus generating current. Also, the height of the Schottky barrier is adjusted depending on the doping concentration of the graphene channel That is, the height of the Schottky barrier is changed depending on the applied gate voltage, and thus the flow of current is changed. Also, it is possible to adjust the height of the Schottky barrier by adjusting the doping concentration of the graphene channel. Accordingly, since the graphene-based ternary barristor has a high current ratio by adjusting a gate voltage, the graphene-based ternary barristor may be applied to a logic circuit.

7 Claims, 9 Drawing Sheets

TERNARY BARRISTOR WITH SCHOTTKY JUNCTION GRAPHENE SEMICONDUCTOR

CLAIM FOR PRIORITY

This application claims priority to Korean Patent Application No. 10-2016-0150019 filed on Nov. 11, 2016 in the Korean Intellectual Property Office (KIPO), the entire contents of which are hereby incorporated by reference.

BACKGROUND

1. Technical Field

Present invention is related in general to a ternary barristor with a graphene semiconductor and more specifically to a graphene-based ternary barristor that uses a Schottky junction between a graphene and a semiconductor and has an adjustable gain to have two step-by-step characteristics by applying a gate voltage.

2. Related Art

Graphene is a two-dimensional hexagonal sp2-boned carbon atom and has interesting physical and electrical characteristics such as electrons behaving like massless Dirac fermion and the anomalous Hall effect at room temperature. In particular, graphene has a band gap close to zero and has a conical conduction band and valence band within an extremely low range for the Fermi level. Also, a ternary device using graphene has an on-off ratio that less than or equal to 10. The on-off ratio is so extremely small that it is difficulty to apply the ternary device to an actual logic circuit.

SUMMARY

Accordingly, example embodiments of the present invention are provided to substantially obviate one or more problems due to limitations and disadvantages of the related art.

Example embodiments of the present invention provide a structure of a graphene-based ternary barristor that may operate at low voltage, use a graphene, and form voltage-current characteristics for three or more distinguished steps.

In some embodiments, a graphene-based ternary barristor using a graphene channel having a region with two different Fermi levels includes a substrate; a gate electrode layer formed on a center of the substrate; a gate insulation layer formed to electrically block the gate electrode layer; a graphene channel layer formed on the gate insulation layer and bonded in parallel to have P-type and N-type or two different Fermi levels; a source electrode layer electrically connected to the graphene channel layer; and a drain electrode layer electrically connected to a semiconductor layer.

The graphene channel layer may be formed between the source electrode layer and the drain electrode layer.

The graphene channel layer may be doped or surface-modified with P-type and N-type dopants through a chemical or physical method or may be formed to have the same type but different Fermi levels.

The graphene channel layer may form regions with different Fermi levels of the graphene and adjust a difference between the regions according to requirements of the device.

The graphene channel layer may form a Schottky barrier by using a heterogeneous junction with the drain electrode.

When a voltage is applied to the gate electrode layer, the Fermi level of the graphene channel layer may be changed, and thus the height of the Schottky barrier may be adjusted.

The graphene channel layer may have different Fermi levels and adjust a height of an energy barrier by adjusting the Fermi levels by means of an external electric field. Thus, the graphene-based ternary barristor may be implemented as a single device with three separate signals.

DESCRIPTION OF EXAMPLE EMBODIMENTS

Figure 1:
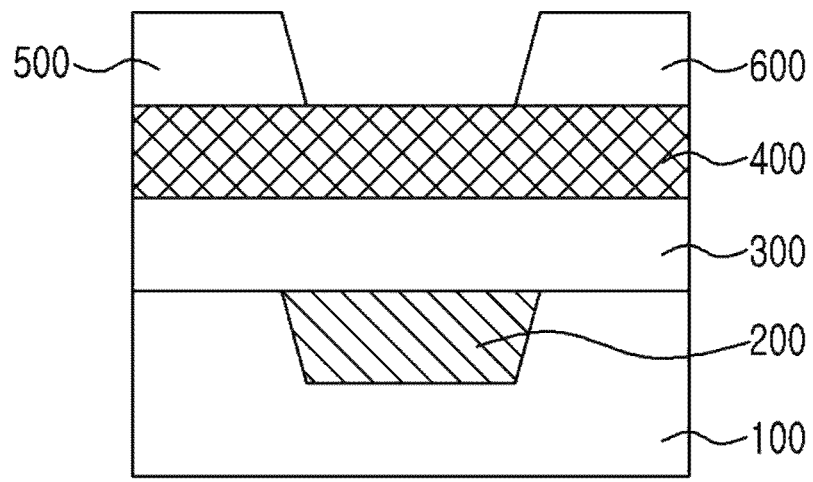
FIG. 1 is a sectional view of a graphene-based ternary barristor according to an embodiment of the present invention

Hereinafter, embodiments of the present invention will be described in detail with reference to the accompanying drawings.

The present invention may be embodied in different forms, and the scope of the present invention is not limited to the following embodiments. Also, the embodiments of the present invention are provided to fully convey the present invention to those skilled in the art. Therefore, the shape and size of the elements in the drawings may be exaggerated for clarity, and the elements denoted by the same reference numerals in the drawings are the same elements.

FIG. 1 is a sectional view of a graphene-based ternary barristor according to an embodiment of the present invention.

Referring to FIG. 1, the sectional view of the graphene-based ternary barristor is shown.

The graphene-based ternary barristor is a graphene-based ternary barristor using a graphene channel having two areas with different Fermi levels and has a substrate 100, a gate electrode layer 200, a gate insulation layer 300, a graphene channel layer 400, a source electrode layer 500, and a drain electrode layer 600. First, a substrate 100 is formed. A gate electrode layer 200 is formed on the center of the substrate 100.

Also, a gate insulation layer 300 is formed on the gate electrode layer 200. Subsequently, a graphene channel layer 400 is formed on the gate insulation layer 300. Also, a source electrode layer 500 electrically connected to one side of the graphene channel layer 400 is formed, and a drain electrode layer 600 is electrically formed on the other side of the graphene channel layer 400. For example, the graphene channel layer 400 may be formed on the center of the substrate 100 between the source electrode layer 500 and the drain electrode 600. For example, the graphene channel layer 400 may be formed on the center of the substrate 100 between the source electrode layer 500 and the drain electrode 600.

Also, the graphene channels or the graphene channel layers shown with referent to FIGS. 1 to 18 may be the same graphene channel or graphene channel layer and may be represented differently depending on additional descriptions of the drawings. The surface modification of the graphene channel or the graphene channel layer, which will be described below, includes doping the graphene channel or the graphene channel layer.

FIGS. 2 to 9 are diagrams illustrating a manufacturing process for a graphene-based ternary barristor according to an embodiment of the present invention.

Referring to FIGS. 2 to 9, the manufacturing process for the graphene-based ternary barristor is shown.

Figure 2:
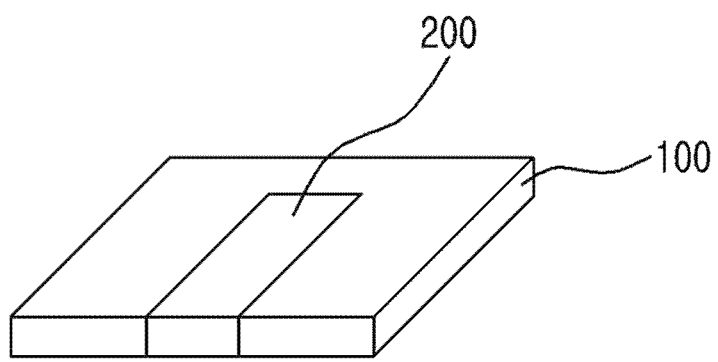
FIG. 2 is perspective view showing gate electrode formed on a substrate according to an embodiment of the present invention.

Referring to FIG. 2, a substrate 100 is formed. Subsequently, a gate electrode layer 200 is formed on the center of the substrate 100. For example, the substrate 100 may be made of any one material selected from a group consisting of sapphire ($Al_2O_3$), ZnO, Si, GaAs, SiC, InP, $SiO_2$, $Si_3N_4$, and GaN, but is not limited thereto. However, it is preferable that the material be $SiO_2$. Also, a gate electrode layer 200 is formed on the center of the substrate 100. For example, the gate electrode layer 200 may be made of a general electrode material (e.g., a metal, a conductive oxide, or the like). However, a material with an appropriate work function may be selected depending on the application of the device. As an example, the gate electrode layer 200 may contain one or more of Ti, TiN, and Pt. Furthermore, the material of the gate electrode layer 200 is not particularly limited as long as the material can be used as the gate electrode layer 200.

Figure 3:
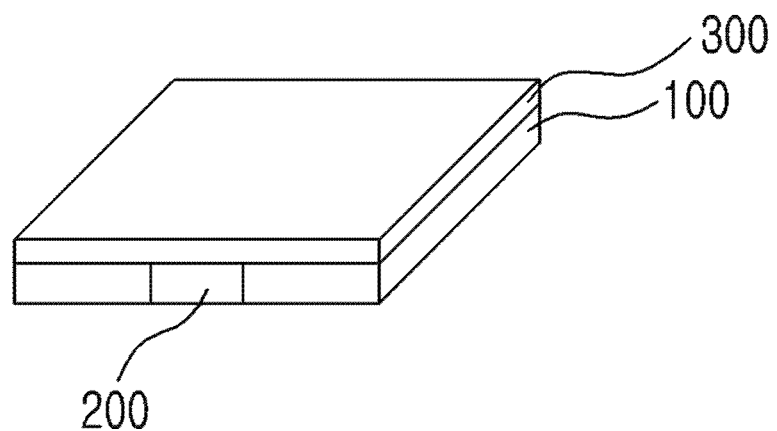
FIG. 3 is perspective view showing gate insulation layer formed on the gate electrode of FIG. 2 according to an embodiment of the present invention.

Referring to FIG. 3, a gate insulation layer 300 is formed on the gate electrode layer 200 in order to electrically block the gate electrode layer 200. The gate insulation layer 300 may contain a silicon oxide layer, a silicon nitride layer, or other materials, and the materials have no limitation on their types. For example, a high-dielectric material layer having a higher dielectric constant than a silicon nitride layer may be included. However, an appropriate material and thickness of the gate insulation layer 300 may be selected and used in order to secure an appropriate operating voltage and reliability depending on the application of the device. As an example, the gate insulation layer 300 may contain $Al_2O_3$.

Figure 4:
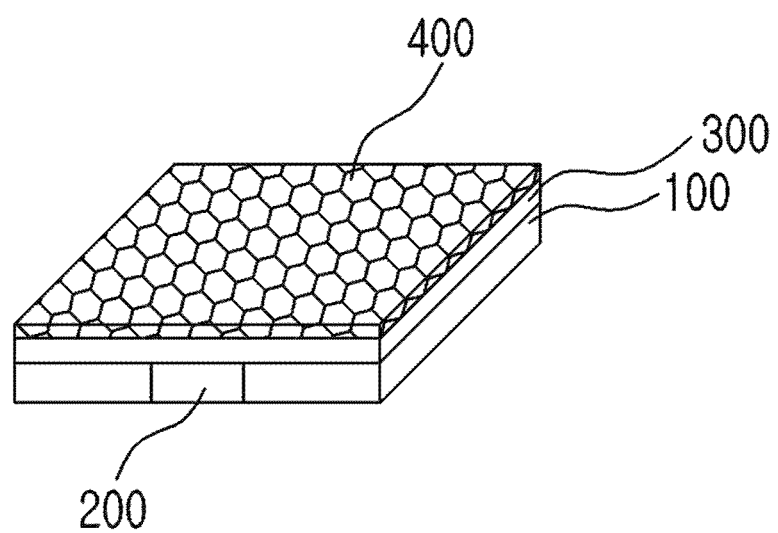
FIG 4. is perspective view showing a graphene channel layer formed on the gate insulation layer of FIG. 3 according to an embodiment of the present invention.

Referring to FIG. 4, a graphene channel layer 400 is formed on the gate insulation layer 300.

Figure 5:
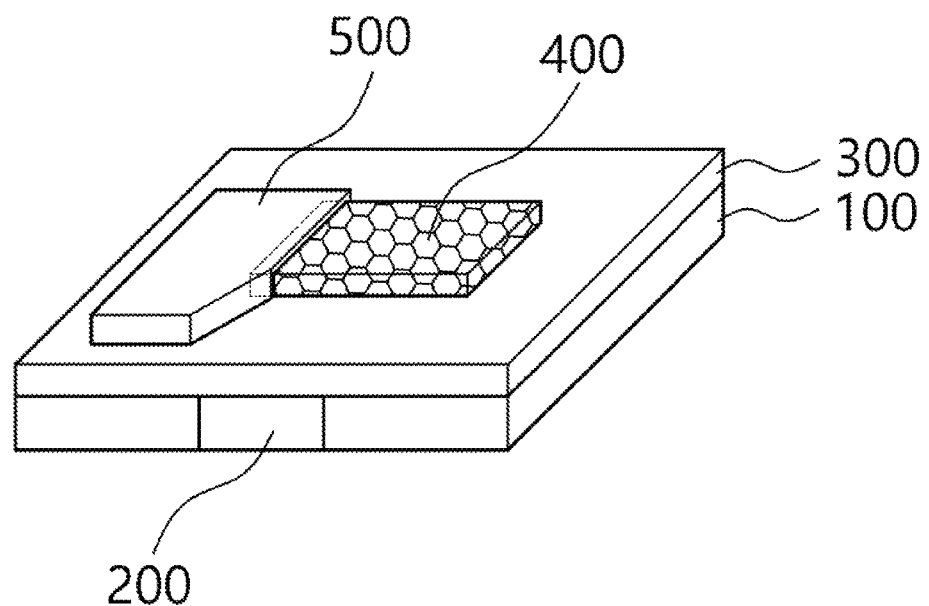
FIG. 5 is perspective view showing a source electrode layer connected to pattern graphene channel layer of FIG. 4 according to an embodiment of the present invention.

Referring to FIG. 5, the graphene channel layer 400 may be patterned by forming single-layered graphene on a catalytic metal substrate through a conventional deposition method and may be transferred onto the substrate 100. Furthermore, a source electrode layer 500 electrically connected to a partial side surface of the grapheme channel layer 400. For example. The material of the source electrode layer 500 is not limited to any one material. However, it is preferable that the source electrode layer 500 be mated of a material usable for a metal usable for a metal electrode.

Figure 6:
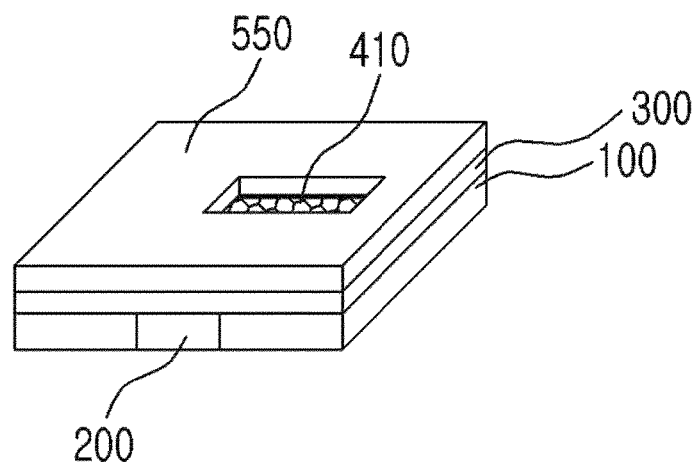
FIG. 6 is perspective view showing first graphene channel of the pattern graphene channel layer of FIG. 5 according to an embodiment of the present invention.
Figure 7:
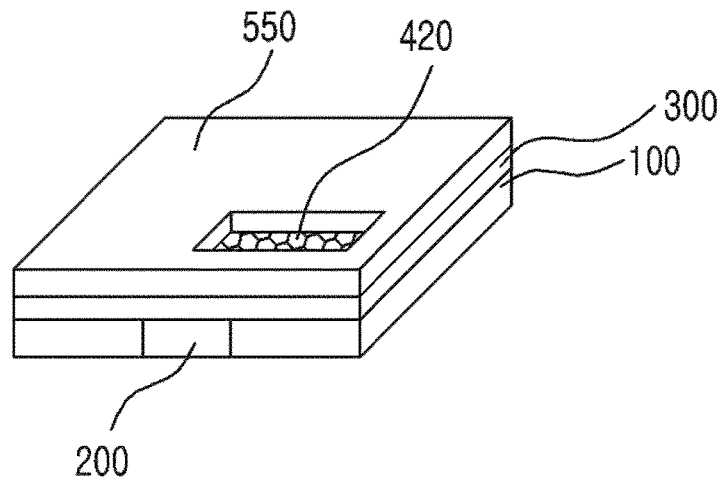
FIG. 7 is perspective view showing second graphene channel of the patterned graphene channel layer of FIG. 5 according to an embodiment of the present invention.

Referring to FIG. 6 to FIG. 7, the graphene channel layer 400 may be doped with p-type or n-type dopants through a chemical or physical method to form a first graphene channel 410. By using several methods such as a hard mask patterning method or a method of doping only a portion of doped graphene upon material growth as the method of doping the graphene channel layer 400, the graphene channel layer 400 may be doped to have two regions with different valid doping states. This is typically used for a semiconductor process, and thus the doping method is not limited to the above-described examples.

Also, the graphene channel layer 400 may be doped with n-type dopants through a chemical or physical method to form a second graphene channel 420. Also, the graphene channel layer 400 may include the first graphene channel 410 and the second graphene channel 420. Accordingly, the graphene channel layer 400 is doped with p-type dopants and n-type dopants or surface-modified with p-type dopants and n-type dopants to have two channels. Accordingly, the graphene channel layer 400 has two different Fermi levels and forms a PN junction in parallel. For example, the graphene channel layer 400 is an e-rod that is doped or surface-modified with p-type dopants and n-type dopants to have two different Fermi levels, and may form a PN junction in parallel. Also, the graphene channel layer 400 may be firstly surface-modified with N-type dopants or P-type dopants and then may be secondly surface-modified with P-type dopants or N-type dopants. That is, the graphene channel layer 400 may be doped or surface-modified with n-type dopants and p-type dopants to have two different Fermi levels and form a parallel junction region. Also, the surface modification includes doping only a selected part through PR coating.

Accordingly, the graphene channel layer 400 is doped or surface-modified with p-type dopants or n-type dopants to have different Fermi level values in one channel Thus, it is possible to adjust the Fermi level of the graphene two times.

Also, the graphene channel layer 400 doped with p-type dopants may be made of Diazonium salt, PAA, $AuCl_3$, TPA, PEO, or F4-TCNQ. The material is not particularly limited as long as the material can be used to form a p-type semiconductor material. Also, the doping of the graphene channel layer 400 may be performed through various chemical or physical methods. For example, the graphene channel layer 400 is doped with p-type dopants and n-type dopants so that the surface of the graphene channel layer 400 may be modified through the doping. For example, the graphene channel layer 400 doped with n-type dopants may be made of PEI or Na—NH2. The material is not particularly limited as long as the material can be used to form an n-type semiconductor material.

Accordingly, the graphene channel layer 400 is surface-modified through two chemical or physical doping operations to include two channels, i.e., a p-type channel and an n-type channel and also have two different Fermi levels. By adjusting the Fermi levels by means of an external electric field to adjust a height of an energy barrier, the graphene channel layer 400 is implemented as a single device having three separate signals.

Referring to FIGS. 6 and 7, a PR coating layer 550 may be formed to cover the source electrode layer 500 and the entire substrate in order to dope the graphene channel layer 400. The PR coating layer 550 may be formed only on a selected part in order to dope the graphene channel layer 400. Also, the PR coating layer 550 may be selectively doped and then removed, and thus the PR coating layer 550 is not used to operate the graphene-based ternary barristor according to this embodiment. However, the PR coating layer 550 may be used to selectively dope the graphene channel layer 400.

Figure 8:
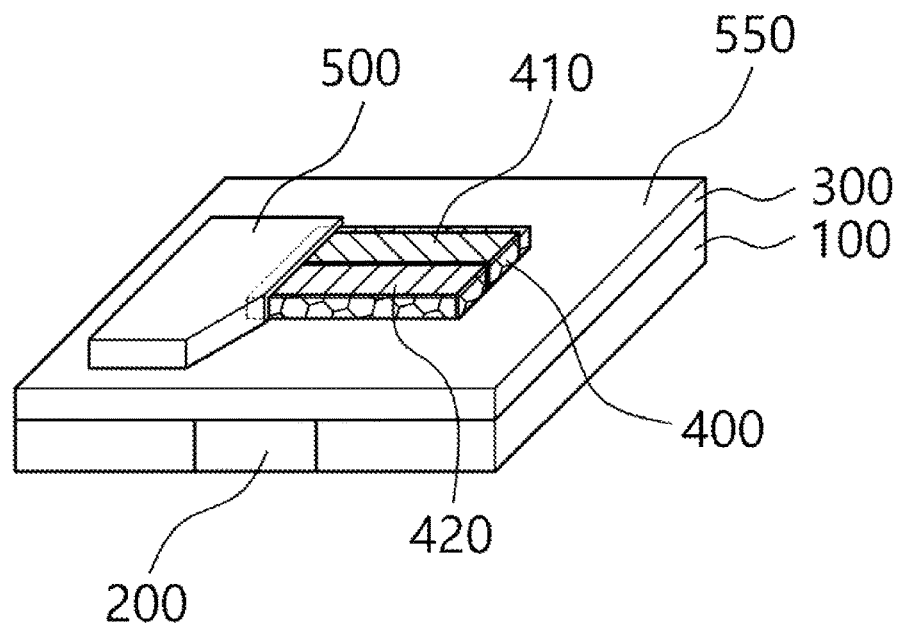
FIG. 8 is perspective view showing the first graphene channel and the second graphene channel according to an embodiment of the present invention.

Referring to FIG. 8, the PR coating layer 550 is removed, and the gate insulation layer 300, the first graphene channel 410, the second graphene channel 420 and the source electrode layer 500 are opened. The graphene channel layer 400 may include two surfaces doped with p-type dopants and n-type dopants in one channel, that is, a first graphene channel 410 doped with p-type dopants or n-type dopants and a second graphene channel 420 doped with n-type dopants or p-type dopants. The source electrode layer 500 covers a portion of the end of the first graphene channel 410 and the second graphene channel 420. Also, the source electrode layer 500 is electrically connected to the first graphene channel 410 and the second grapheme channel 420.

Figure 9:
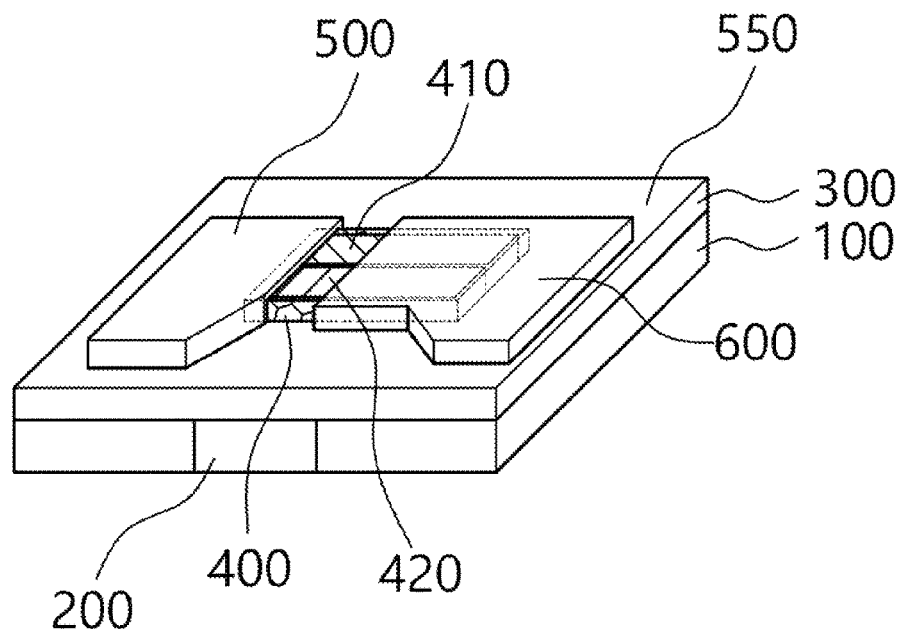
FIG. 9 is perspective view showing drain electrode layer connected to the first graphene channel and the second graphene channel of FIG. 8 according to an embodiment of the present invention.

Referring to FIG. 9, a drain electrode layer 600 is formed opposite to the source electrode, and is electrically connected to another portion of the first graphene channel 410 and the second graphene channel 420. In particular, the drain electrode layer 600 is formed on the first graphene channel 410 and the second graphene channel 420 and is formed so as to cover at least half of the first graphene channel 410 and the second graphene channel 420. The drain electrode is spaced apart from the source electrode.

If the first graphene channel 410 is doped with p-type, the second graphene channel 420 is doped with n-type. That is, the first graphene channel 410 and the second graphene channel 420 are complementary doped with each other. Furthermore, between the source electrode layer 500 and the drain electrode layer 600, the first graphene channel 410 and the second graphene channel 420 are connected in parallel to the two electrodes.

Also, the material of the drain electrode layer 600 is not limited to any one material. However, the drain electrode layer 600 may be made of any one or at least one material that is usable as a semiconductor material.

Also, the graphene channel layer 400 has a single-layered structure, and thus its band diagram is in the shaped of a Dirac cone. Also, a Schottky barrier is formed through a heterogeneous junction between the graphene channel layer 400 and the drain electrode layer 600. For example, it is possible to adjust a height of the barrier by applying a voltage to the gate electrode layer 200 to move the Fermi level of the graphene channel layer 400. Also, it is possible to adjust the height of the Schottky barrier at a heterogeneous junction part between a graphene channel and a semiconductor depending on the doping type and concentration of the graphene channel layer 400. Accordingly, it is possible to adjust a threshold voltage of a graphene-based ternary barristor of this embodiment to various values. For example, when a bias is not applied to the gate electrode layer 200, the Schottky barrier between a semiconductor and the graphene channel layer 400 doped with p-type dopants and n-type dopants is raised, and thus current does not flow. Also, when a bias is applied to the gate electrode layer 200, it is possible to adjust the height of the Schottky barrier at the heterogeneous junction part between the graphene channel layer 400 and the semiconductor depending on the p-type doping and n-type doping of the graphene channel layer 400 or depending on the p-type dopant concentration and n-type dopant concentration of the graphene channel layer 400. For example, when a bias applied to a gate increases to a voltage Vth1 between the semiconductor and the graphene channel layer 400 doped with p-type dopants, the Schottky barrier is lowered, and thus current starts to flow. Also, when a bias having a voltage Vth1 to Vth2 is applied to the gate electrode layer 200, the Fermi level of the graphene channel layer 400 doped with the p-type dopants may be affected by a pinning and converged to a constant value. When the Schottky barrier of the graphene channel layer 400 doped with n-type dopants is so high that current cannot flow, the current may be converged by the semiconductor and the graphene channel layer 400 doped with p-type dopants. Also, when a bias greater than or equal to a voltage Vth2 is applied to the gate electrode layer 200, the Schottky barrier between the semiconductor and the graphene channel layer 400 doped with n-type dopants is lowered, and thus current starts to increase again.

Accordingly, graphene-based ternary barristor according to this embodiment forms a PN junction in parallel in the graphene channel layer 400. Also, the graphene channel layer 400 may have two different Fermi levels in one channel. It is possible to predict three current values by adjusting the Schottky barrier by a gate voltage.

Figure 10:
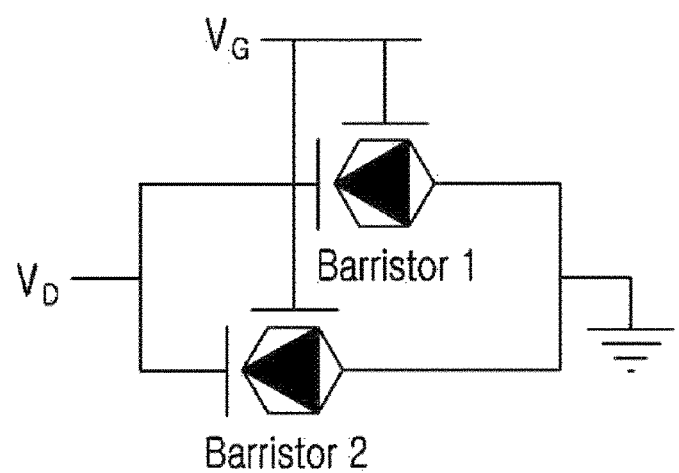
FIG. 10 is a circuit diagram showing a graphene-based ternary barristor according to an embodiment of the present invention.

FIG. 10 is a circuit diagram showing a graphene-based ternary barristor according to an embodiment of the present invention.

Referring to FIG. 10, the circuit diagram of the graphene-based ternary barristor is shown.

The graphene-based ternary barristor according to this embodiment may form a PN junction in parallel in a graphene channel in which a heterogeneous junction is formed between a drain electrode and a graphene. Also, the graphene channel may have different Fermi level values through graphene doping and surface modification with P-type dopants and N-type dopants. For example, when a voltage is applied to the gate electrode layer, the Fermi level of the graphene channel layer is moved by the graphene channel layer, and thus it is possible to adjust a height of the barrier.

Accordingly, the graphene channel layer having both P-type and N-type characteristics may implement a ternary device in which a Schottky barrier is formed by a heterogeneous junction with the drain electrode and connected in parallel.

FIGS. 11 to 16 are band diagrams illustrating an operation of a barristor according to an embodiment of the present invention.

The same reference numerals in FIGS. 11 to 16 have the same regions and the same structures. For example, a gate electrode 16, a Fermi level 15, a graphene channel 11, and a substrate 10 are shown in the drawings. The following description of the same reference numerals will be omitted.

Figure 11:
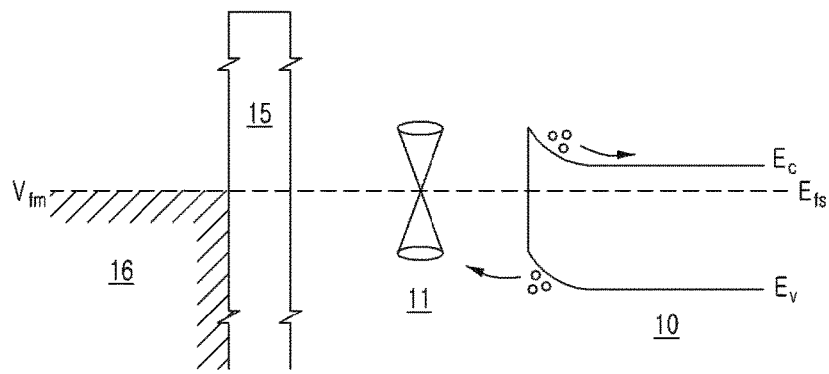
FIG. 11 is band diagram when bias is not applied to gate electrode layer of the barristor according to an embodiment of the present invention.
Figure 12:
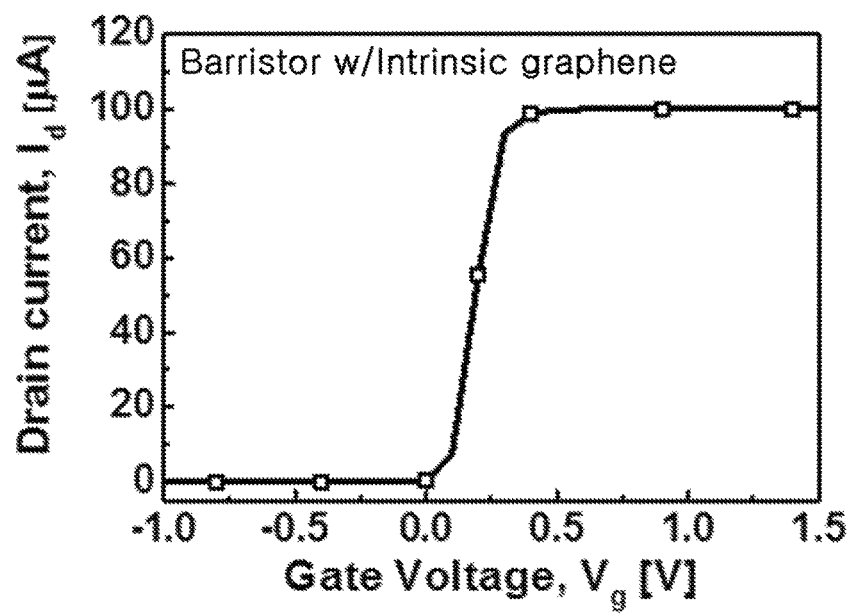
FIG. 12 is diagram showing drain current with respect to gate voltage when bias is not applied to gate electrode layer of the barristor according to an embodiment of the present invention.

Referring to FIGS. 11 and 12, the band diagrams are shown in case where a bias is not applied to the gate electrode layer or in case where a voltage difference between the gate layer and the source electrode layer is 0 V.

Also, the gate voltage according to this embodiment refers to a voltage difference between the gate electrode 16 and the source electrode. Dirac points of the graphene channel 11 and the Fermi level 15 of the gate electrode 16 have the same value, and this is shown as the same Fermi level 15. Also, the graphene channel 11 is configured as a single-layered graphene and may form a Schottky junction with the semiconductor substrate 10. That is, the Fermi level 15 of the gate electrode 16 with metal characteristics and the Fermi level 15 of the semiconductor substrate 10 have the same value. Also, a Schottky junction appears between the graphene channel 11 and the semiconductor substrate 10, and thus a Schottky barrier is formed. For example, the Fermi level 15 of the semiconductor substrate 10 may be higher than that of an intrinsic semiconductor, and an energy barrier may appear at a junction interface between the semiconductor substrate 10 and the graphene channel 11.

For example, when a voltage is applied to the gate electrode layer 16, an electron-hole pair is generated in the graphene channel 11 and the semiconductor substrate 10 near the interface being in contact with the graphene channel 11. Conduction band electrons generated in the interface region between the semiconductor substrate 10 and the graphene channel 11 move to a bulk region of the semiconductor substrate 10 according to an inclination of energy, and then are supplied to the drain electrode. Also, valence band holes moves to the graphene channel 11 over the energy barrier, and thus electric current is generated.

Figure 13:
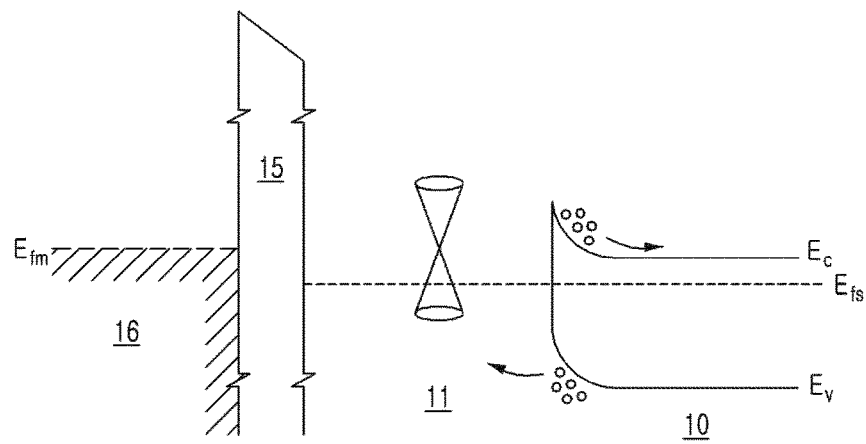
FIG. 13 is band diagram when negative bias is applied to gate electrode layer with respect to source electrode of the barristor according to an embodiment of the present invention.
Figure 14:
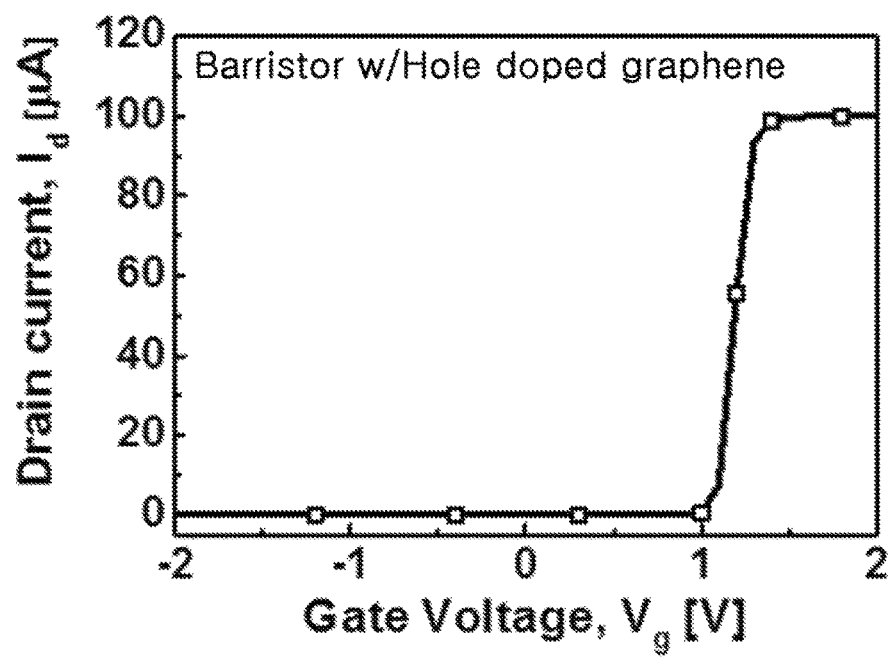
FIG. 14 is diagram showing drain current with respect to gate voltage when negative bias is applied to gate electrode layer with respect to source electrode of the barristor according to an embodiment of the present invention.

Referring to FIGS. 13 and 14, a negative value is caused by a voltage difference between the gate electrode 16 and the source electrode. Due to a negative bias of the gate electrode 16, the Dirac point of the graphene channel 11 is set to be less than the Fermi level of the gate electrode 16. Also, the Fermi level of the semiconductor substrate may be lowered to a value lower than that of the graphene channel 11. Accordingly, a high Schottky barrier is formed at the interface between the graphene channel 11 and the semiconductor substrate 10.

Also, when an current is applied, an electron-hole pair is generated at the interface region between the semiconductor substrate 10 and the graphene channel 11. A majority of the conduction band electrons may move to the drain electrode through the bulk region of the semiconductor substrate 10 along a steep energy slope of the conduction band. Complementarily, the valence band holes may move to the graphene channel 11 along a steep energy slope of the valence band. Accordingly, this case has a higher amount of current than that of FIGS. 11 and 12.

Accordingly, as the gate voltage decreases when the same amount of current is provided, the amount of current increases.

Figure 15:
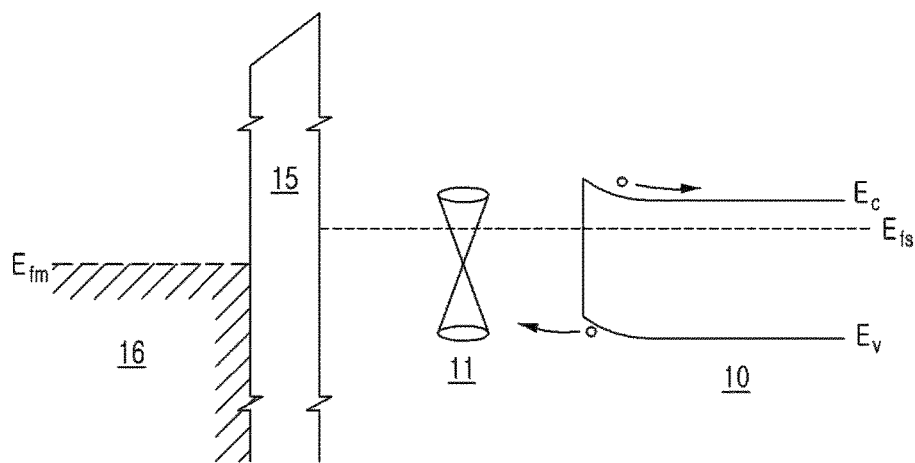
FIG. 15 is band diagram when positive bias is applied to gate electrode layer with respect to source electrode of the barristor according to an embodiment of the present invention.
Figure 16:
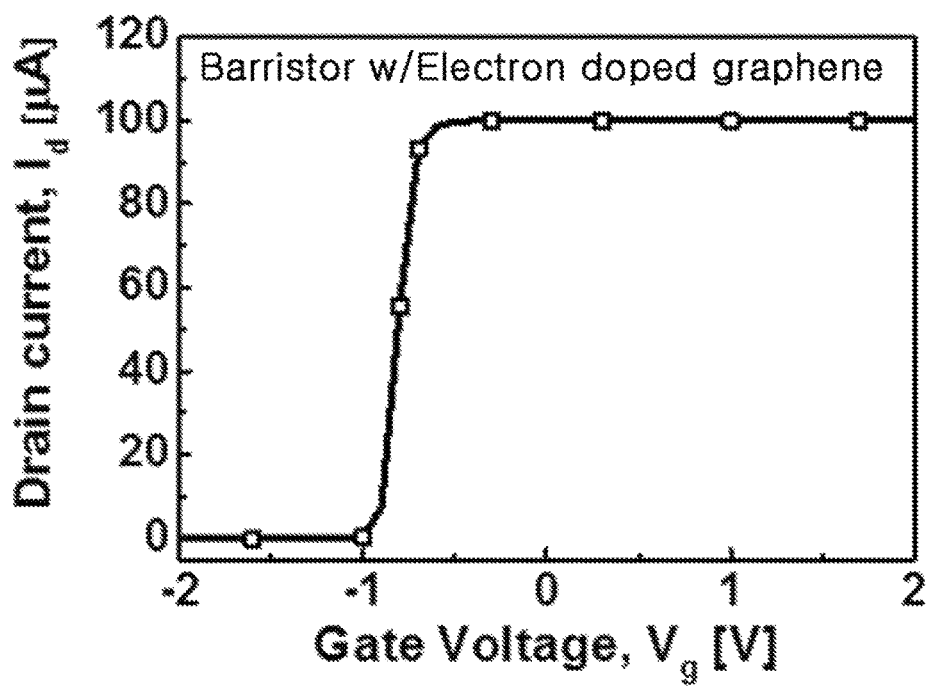
FIG. 16 is diagram showing drain current with respect to gate voltage when positive bias is applied to gate electrode layer with respect to source electrode of the barristor according to an embodiment of the present invention.

Referring to FIGS. 15 and 16, a positive voltage is applied through the gate electrode 16. Accordingly, the Dirac point of the graphene channel has a value higher than the Fermi level 15 of the gate electrode 16, and the Fermi level of the semiconductor substrate 10 has a value higher than the Dirac point of the graphene channel 11. This means that the energy barrier at the interface of the semiconductor substrate 10 in contact with the graphene channel 11 decreases. That is, the energy barrier decreases in the interface region of the graphene channel 11 and the bulk region of the semiconductor substrate 10.

When a voltage is applied to the gate electrode 16, an electron-hole pair is generated in the semiconductor substrate 10. The conduction band electrons formed by electron-hole pairs at the junction interface between the semiconductor substrate 10 and the graphene channel 11 move along a slope of the conduction band, but the slope of the conduction hand has a low gradient. Thus, the probability that the conduction band electrons will move to the drain electrode decreases. The above description may be applied to the valence band holes of the semiconductor substrate 10 as it is. That is, the probability that the generated valence band holes will move to the graphene channel 11 decreases, thus causing a decrease in current.

Accordingly, depending on the application of the gate voltage as shown in FIGS. 11 to 16, the Fermi level Efs of the semiconductor substrate 10 is changed, and the Schottky barrier at the interface between the graphene channel 11 and the semiconductor substrate 10 is changed. In particular, when a voltage is applied to the gate electrode 15, electron-hole pairs move to the graphene channel 11 or the semiconductor substrate 10 depending on the gradient of the energy band. That is, the conduction band electrons of the semiconductor substrate 10 generated at the interface region between the semiconductor substrate 10 and the graphene channel 11 move to the drain electrode along the slope of the energy band, and the valence band holes of the semiconductor substrate 10 moves to the graphene channel 11 along the slope of the energy band. This forms a potential and an current between the source electrode and the drain electrode.

Accordingly, the Schottky barrier may be changed depending on the aspect of the applied gate voltage, and thus the amount of current may be changed.

Figure 17:
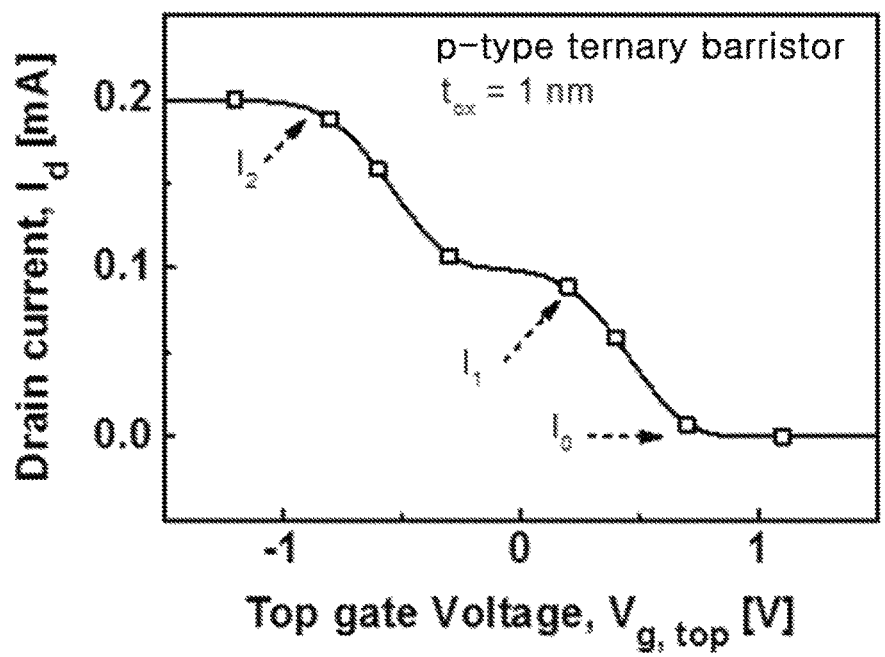
FIG. 17 is an Id-Vg graph of a P-type barristor of the graphene-based ternary barristor according to an embodiment of the present invention.
Figure 18:
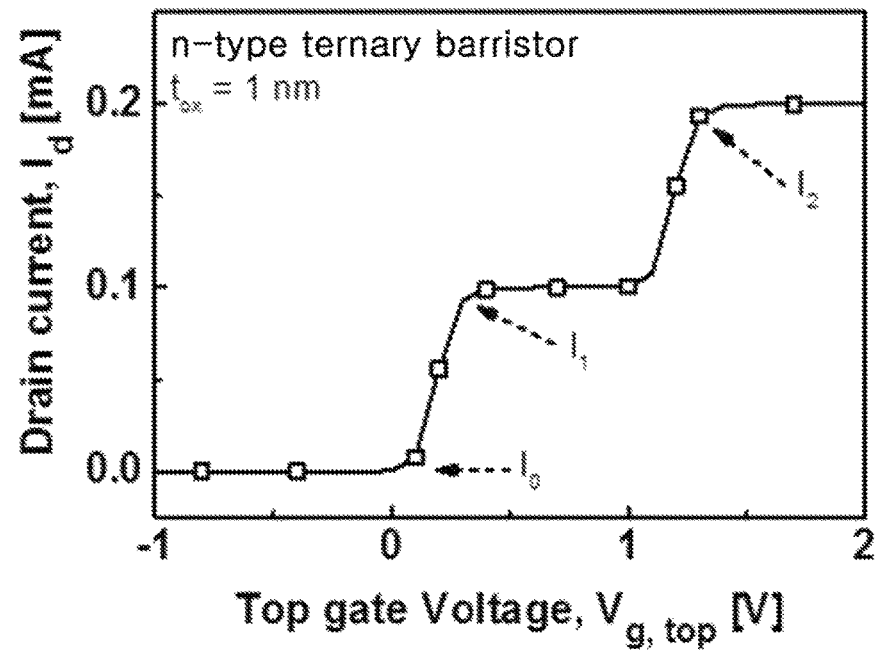
FIG. 18 is an Id-Vg graph of an N-type barristor of the graphene-based ternary barristor according to an embodiment of the present invention.

FIGS. 17 and 18 are Id-Vg characteristics graphs having 3-step signal of a graphene-based ternary barristor according to an embodiment of the present invention.

Referring to FIGS. 17 and 18, Id-Vg graphs having 3-step signal of a graphene-based ternary barristor according to an embodiment of the present invention are shown.

First, FIG. 17 is an Id-Vg graph of a P-type barristor of the graphene-based ternary barristor. FIG. 18 is an Id-Vg graph of an N-type barristor of the graphene-based ternary barristor. That is, the graphene channel layer of the graphene-based ternary barristor according to this embodiment has both P-type and N-type characteristics. Also, the height of the Schottky barrier may be changed depending on the doping concentration of the graphene channel layer. That is, the height of the Schottky barrier may be adjusted by adjusting the doping concentration of the graphene channel layer. Accordingly, it is possible to adjust a threshold voltage of the graphene-based ternary barristor of this embodiment to various values. As shown in a voltage-current characteristic graph of FIGS. 15 and 16, the graphene-based ternary barristor according to this embodiment may have a wide current ratio even in the same voltage. That is, the graphene-based ternary barristor may have the height of the Schottky barrier adjustable by using a gate voltage through the graphene channel layer and may have a high current ratio of $10^4$ to $10^6$, thus applying to a logic circuit.

Accordingly, it is possible to adjust the height of the Schottky barrier depending on the doping concentration of the graphene channel layer having both P-type and N-type characteristics. Also, when the height of the Schottky barrier is adjusted to 0.3 eV or more, the graphene-based ternary barristor may be implemented as a single device with three separate signals I0, I1, and I2.

According to the present invention, it is possible to adjust a barrier height for each region by simultaneously adjusting two or more different Fermi levels of a region formed on the graphene channel layer by applying a voltage to the gate electrode.

It is also possible to apply the graphene-based ternary barristor of the present invention to a logic circuit because the graphene-based ternary barristor has the height of the Schottky barrier adjustable by means of the gate voltage to have a high current ratio.

Also, three or more signals may be transmitted by a single device based on the graphene-based ternary barristor, and thus the graphene-based ternary barristor can have a high economic efficiency as a next-generation ternary barristor.

Also, advantageous effects of the invention are not limited to the aforementioned effects, and other advantageous effects that are not described herein should be clearly understood by those skilled in the art from the following description.

What is claimed is:

1. A graphene-based ternary barristor using a graphene channel having a region with two different Fermi levels, the graphene-based ternary barristor comprising:
    a substrate;
    a gate electrode layer formed on a center of the substrate;
    a gate insulation layer formed to electrically block the gate electrode layer;
    a graphene channel layer formed on the gate insulation layer, wherein the graphene channel layer comprises a first graphene channel and a second graphene channel;
    a source electrode layer electrically connected to one side of the graphene channel layer; and
    a drain electrode layer electrically connected to opposite sides of the source electrode layer,
    wherein the first graphene channel and the second graphene channel are complementarily doped with each other, and are connected in parallel to the source electrode layer and the drain electrode layer, so that the first graphene channel and the second graphene channel have two different Fermi levels from each other.

2. The graphene-based ternary barristor of claim 1, wherein the graphene channel layer is doped or surface-modified with P-type and N-type dopants through a chemical or physical method.

3. The graphene-based ternary barristor of claim 2, wherein the graphene channel layer forms a PN junction.

4. The graphene-based ternary barristor of claim 2, wherein the graphene channel layer adjusts a Fermi level of graphene.

5. The graphene-based ternary barristor of claim 1, wherein the graphene channel layer forms a Schottky barrier by using a heterogeneous junction with the drain electrode.

6. The graphene-based ternary barristor of claim 1, wherein when a voltage is applied to the gate electrode layer, the Fermi level is moved by the graphene channel layer to adjust a barrier height.

7. The graphene-based ternary barristor of claim 1, wherein the graphene channel layer has two different Fermi levels and adjusts a height of an energy barrier by adjusting the Fermi levels by means of an external electric field, and thus the graphene-based ternary barristor is implemented as a single device with three separate signals.

* * * * *